(12) United States Patent
Fukushima

(10) Patent No.: US 9,624,579 B2
(45) Date of Patent: Apr. 18, 2017

(54) FILM FORMING APPARATUS, FILM FORMING METHOD, AND NON-TRANSITORY COMPUTER-READABLE STORAGE MEDIUM

(71) Applicant: TOKYO ELECTRON LIMITED, Tokyo (JP)

(72) Inventor: Kohei Fukushima, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/664,105

(22) Filed: Mar. 20, 2015

(65) Prior Publication Data

US 2015/0275366 A1 Oct. 1, 2015

(30) Foreign Application Priority Data

Mar. 27, 2014 (JP) .................... 2014-066669

(51) Int. Cl.
*H01L 21/31* (2006.01)
*C23C 16/455* (2006.01)
(Continued)

(52) U.S. Cl.
CPC ...... *C23C 16/45557* (2013.01); *C23C 16/345* (2013.01); *C23C 16/4412* (2013.01);
(Continued)

(58) Field of Classification Search
CPC ... H01L 21/0228; C23C 16/52; C23C 16/455; C23C 16/45502; C23C 16/45561; C23C 16/45587; C23C 16/45557
See application file for complete search history.

(56) References Cited

U.S. PATENT DOCUMENTS

2004/0011404 A1* 1/2004 Ku ..................... F16K 7/16
137/341
2005/0126483 A1* 6/2005 Tognetti ............ C23C 16/403
118/715
(Continued)

FOREIGN PATENT DOCUMENTS

JP 9-17734 A 1/1997
JP 2004-063902 A 2/2004
(Continued)

*Primary Examiner* — Zandra Smith
*Assistant Examiner* — Evan Clinton
(74) *Attorney, Agent, or Firm* — Nath, Goldberg & Meyer; Jerald L. Meyer

(57) ABSTRACT

An apparatus for forming a thin film on a substrate in a reaction container by alternately supplying a raw material gas and a reaction gas into the reaction container under a vacuum atmosphere is provided. The apparatus includes: a raw material gas supply unit installed in an end portion of a supply path of the raw material gas; a pressure adjusting valve installed in an vacuum exhaust path; a pressure regulating valve and an opening and closing valve which are respectively installed in a bypass path detouring the pressure adjusting valve; a tank installed in the middle of the supply path of the raw material gas; a flow rate adjusting valve installed in a downstream side of the tank; and a control unit configured to control the opening and closing valve to be opened when the raw material gas stored in the tank is supplied into the reaction container.

7 Claims, 8 Drawing Sheets

(51) Int. Cl.
  *C23C 16/52*     (2006.01)
  *H01L 21/02*     (2006.01)
  *C23C 16/34*     (2006.01)
  *C23C 16/44*     (2006.01)

(52) U.S. Cl.
  CPC .. *C23C 16/45544* (2013.01); *C23C 16/45546* (2013.01); *C23C 16/52* (2013.01); *H01L 21/0228* (2013.01)

(56) References Cited

U.S. PATENT DOCUMENTS

| | | | | |
|---|---|---|---|---|
| 2005/0282365 | A1* | 12/2005 | Hasebe | C23C 16/24 438/513 |
| 2006/0032444 | A1* | 2/2006 | Hara | C23C 16/4481 118/715 |
| 2015/0228474 | A1* | 8/2015 | Hanashima | H01L 21/0228 438/778 |

FOREIGN PATENT DOCUMENTS

| | | |
|---|---|---|
| JP | 2006-32610 A | 2/2006 |
| JP | 2011-216906 A | 10/2011 |
| JP | 2014-236069 A | 12/2014 |

\* cited by examiner

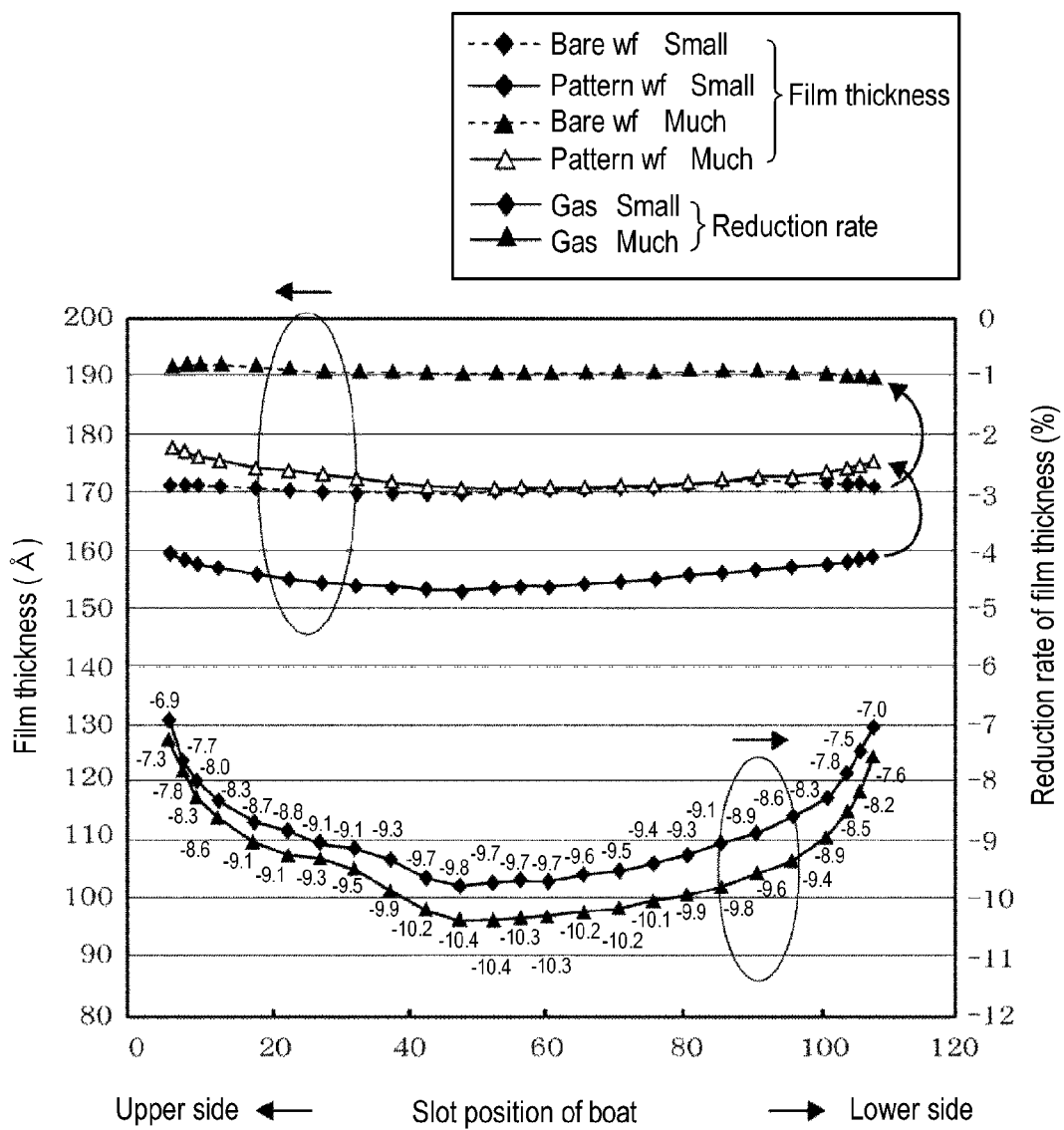

FILM FORMING APPARATUS, FILM FORMING METHOD, AND NON-TRANSITORY COMPUTER-READABLE STORAGE MEDIUM

CROSS-REFERENCE TO RELATED APPLICATION

This application claims the benefit of Japanese Patent Application No. 2014-066669, filed on Mar. 27, 2014, in the Japan Patent Office, the disclosure of which is incorporated herein in its entirety by reference.

TECHNICAL FIELD

The present disclosure relates to a film forming apparatus for forming a thin film by supplying a raw material gas for film formation to a substrate received within a reaction container under a vacuum atmosphere, a film forming method, and a non-transitory computer-readable storage medium storing the film forming method.

BACKGROUND

For example, as an apparatus for forming a thin film such as a silicon nitride (Si—N) film, a film forming apparatus has been used that performs a film forming process by airtightly loading a wafer boat (substrate holder) into a vertical reaction tube from the bottom side. A substrate such as a semiconductor wafer (hereinafter, referred to as a wafer) is then loaded in a shelf shape in the wafer boat. A gas injector for supplying a silicon-based raw material gas (e.g., a dichlorosilane (DCS) gas) and a nitrogen-based reaction gas (e.g., an ammonia ($NH_3$) gas) to each wafer is installed inside the reaction tube. In addition, a pair of parallel electrodes for plasma-gasifying an ammonia gas are installed outside the reaction tube.

When forming the above described silicon nitride film, this film forming apparatus uses a so-called ALD (Atomic Layer Deposition) method. The ALD method is a method of performing a film formation cycle, which alternately supplies plasmas of a raw material gas and a reaction gas to each wafer multiple times. Thus, a reaction product generated by reaction of the plasmas of the raw material gas and the reaction gas is stacked on each wafer by an amount corresponding to the number of times of the film formation cycle and a thin film is formed. Accordingly, in the ALD method, the repetition number of film formation cycle correlates with the dimension of a film thickness of the thin film. In view of such a principle, it is easy to control the dimension of the film thickness.

However, in each film formation cycle, if it is intended to set a standby time until the raw material gas is completely adsorbed to the surface of the wafer, in other words, if it is intended to fulfill an ideal ALD reaction by performing an adsorption reaction until an adsorption amount of the raw material gas is saturated, a process time is lengthened, thereby decreasing throughput. That is, putting aside a theoretical reaction mechanism, when practically forming a thin film by using an actual apparatus, it is difficult to take a long adsorption time until an adsorption reaction of a raw material gas stops, so to speak, self-limitedly, in consideration of productivity, a film formation temperature of a process, and types of raw material gases in use.

Thus, when forming a thin film under a process condition that adsorption of a raw material gas is not saturated, it is very difficult to control the dimension of a film thickness of a thin film. Accordingly, when performing a film forming process on a wafer, a film formation test of a thin film is conducted also on a dummy wafer (bare wafer) for measurement of a film thickness within the same batch together with a product wafer, thereby checking the dimension of a film thickness of a thin film.

However, since a product wafer with a pattern formed on its surface has a large surface area compared to a dummy wafer without a pattern, the consumption amount of a raw material gas is increased. Thus, even though a film thickness dimension is checked using a dummy wafer, an actual product wafer easily has a smaller film thickness dimension of a thin film compared to the dummy wafer. Further, as the number of product wafers loaded in a wafer boat increases, the consumption amount of a raw material gas increases and thus it is difficult to control a film thickness dimension of a thin film even due to the input number of product wafers per a batch.

The technology of constantly maintaining an internal pressure of a buffer tank when forming an alumina film is known. However, the above-described problem has not been known.

SUMMARY

Some embodiments of the present disclosure provide a technique that can easily adjust a film thickness dimension of a thin film when forming the thin film by supplying a raw material gas for film formation to a substrate received in a reaction container under a vacuum atmosphere.

According to one embodiment of the present disclosure, there is provided an apparatus for forming a thin film on a substrate in a reaction container by alternately supplying a raw material gas and a reaction gas, which reacts with the raw material gas to generate a reaction product, into the reaction container under a vacuum atmosphere, the apparatus includes: a raw material gas supply unit installed in an end portion of a supply path of the raw material gas to supply the raw material gas into the reaction container; a pressure adjusting valve installed in an vacuum exhaust path configured to vacuum-exhaust an interior of the reaction container; a pressure regulating valve configured to regulate an internal pressure of the reaction container to a preset pressure and an opening and closing valve which are respectively installed in a bypass path detouring the pressure adjusting valve; a tank installed in the middle of the supply path of the raw material gas and configured to store the raw material gas in an increased pressure state; a flow rate adjusting valve installed in a downstream side of the tank in the supply path of the raw material gas; and a control unit configured to control the opening and closing valve to be opened when the raw material gas stored in the tank is supplied into the reaction container.

According to another embodiment of the present disclosure, there is provided a method of forming a film on a substrate in a reaction container by alternately supplying a raw material gas and a reaction gas, which reacts with the raw material gas to generate a reaction product, into the reaction container under a vacuum atmosphere, the method includes: using a pressure regulating value installed in a vacuum exhaust path to regulate an internal pressure of the reaction container to a pressure, P1, and a raw material gas supply unit, and storing a raw material gas within a tank in an increased pressure state, the tank being installed in the middle of a supply path of the raw material gas toward the raw material gas supply unit; and supplying the raw material gas from the tank into the reaction container through the raw material gas supply unit for a time Δt, in a state that a gas flow rate is adjusted to a preset flow rate by a flow rate adjusting valve installed in a downstream side of the tank, while regulating an internal pressure of the reaction container to P1 by operation of the pressure regulating valve between a time before a lapse of Δt×(⅓) starting from a supply start time t1 of the raw material gas and a time after a lapse of Δt×(⅔) starting from the supply start time t1 of the raw material gas.

According to another embodiment of the present disclosure, there is provided a non-transitory computer-readable storage medium storing a computer program that operates on a computer, wherein the computer program comprises the steps for performing the method according to the present disclosure.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is a characteristic view illustrating experiment results obtained in an embodiment of the present disclosure.

DETAILED DESCRIPTION

Hereinafter, some embodiments of the present disclosure will be described with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
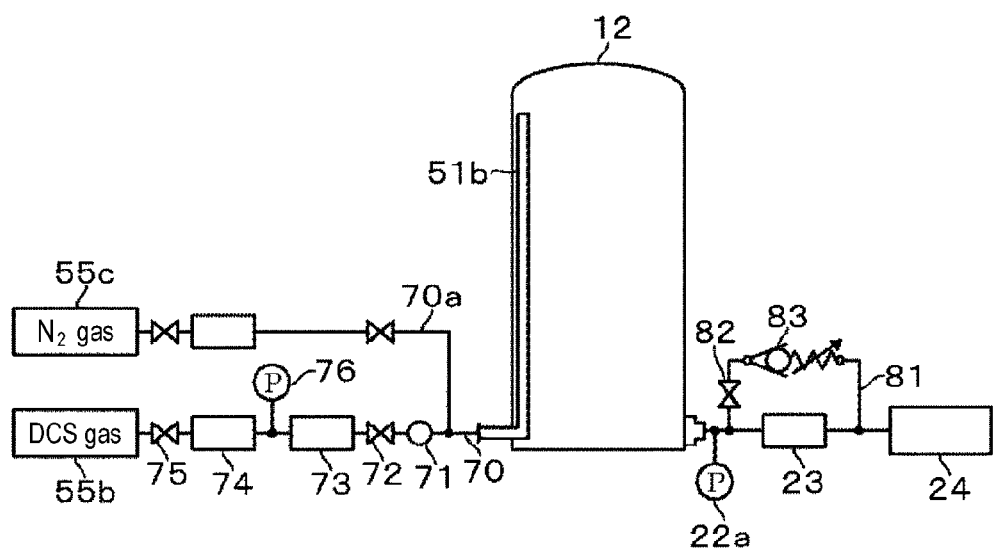
FIG. 1 is a schematic view illustrating an example of a film forming apparatus according to an embodiment of the present disclosure.
Figure 2:
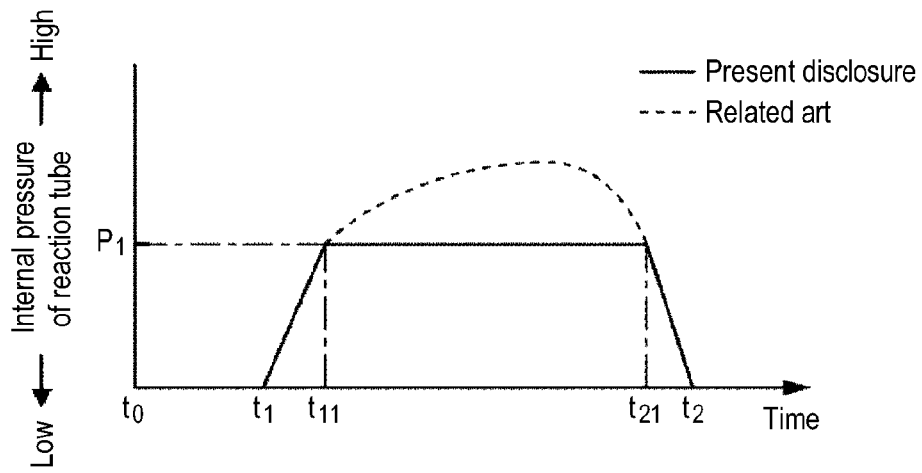
FIG. 2 is a schematic view illustrating transitions of an internal pressure of a reaction tube when a raw material gas is supplied to the film forming apparatus.

An example of an embodiment regarding a film forming apparatus of the present disclosure will be described with reference to FIGS. 1 to 4. The film forming apparatus is configured to form a thin film with an ALD method of stacking a reaction product by alternately supplying a raw material gas and a reaction gas, which react with each other, to a wafer W, and is a batch-type vertical heat processing apparatus that performs a film forming process collectively on a plurality of wafers W within a vertical reaction tube (reaction container) 12. Further, by installing a later-described bypass line 81 in the exhaust side of the reaction tube 12 in this apparatus as illustrated in FIG. 1, an approximately constant process pressure P1 is maintained within the corresponding reaction tube 12 from a time t1 to a time t2 during which a raw material gas is supplied to each wafer W as schematically illustrated in FIG. 2. Subsequently, details of each component of the apparatus will be described. Further, FIG. 1 illustrates a simplified film forming apparatus and FIG. 2 also illustrates an internal pressure of the reaction tube 12 when a raw material gas is supplied in prior art.

Figure 3:
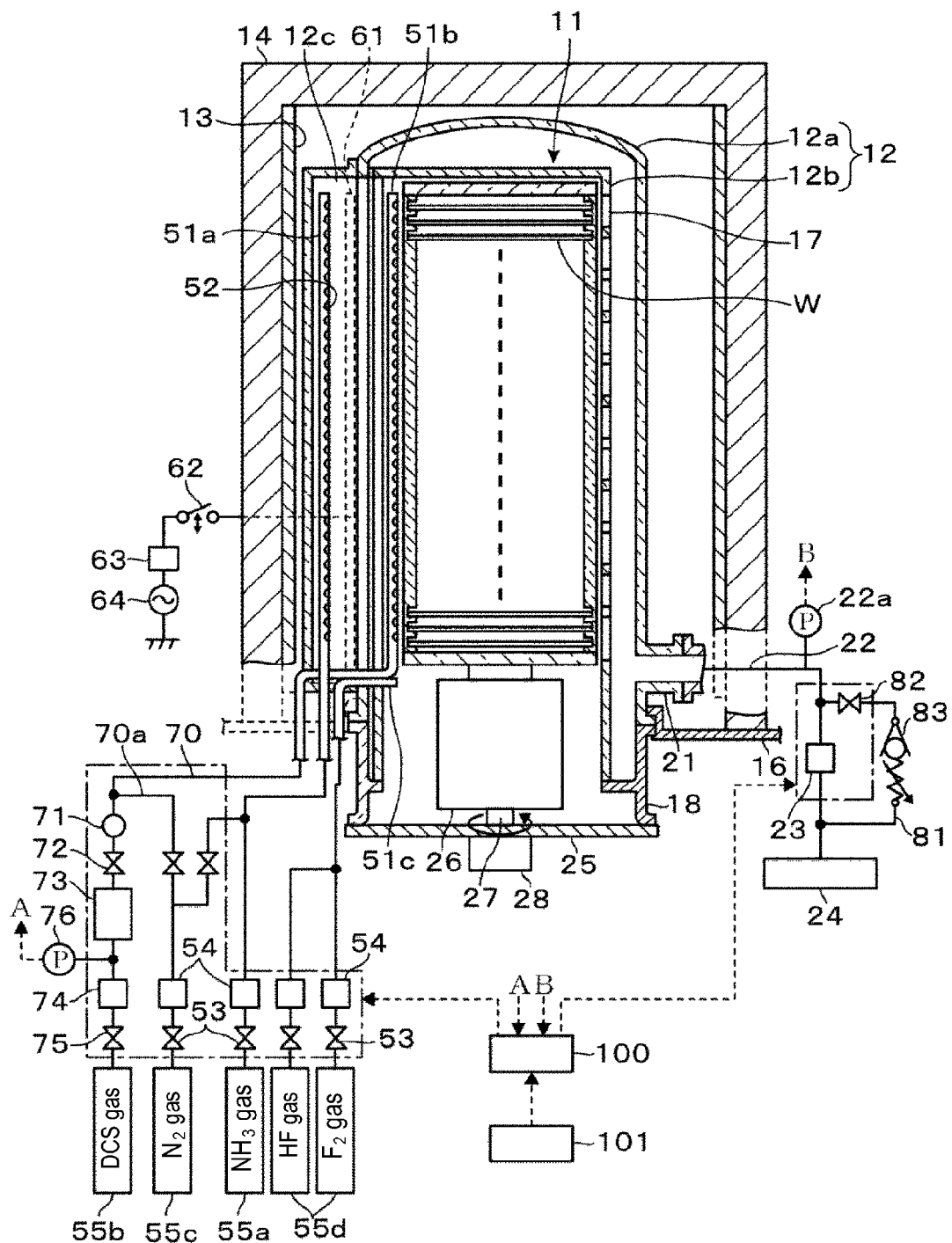
FIG. 3 is a vertical-sectional view illustrating the film forming apparatus.
Figure 4:
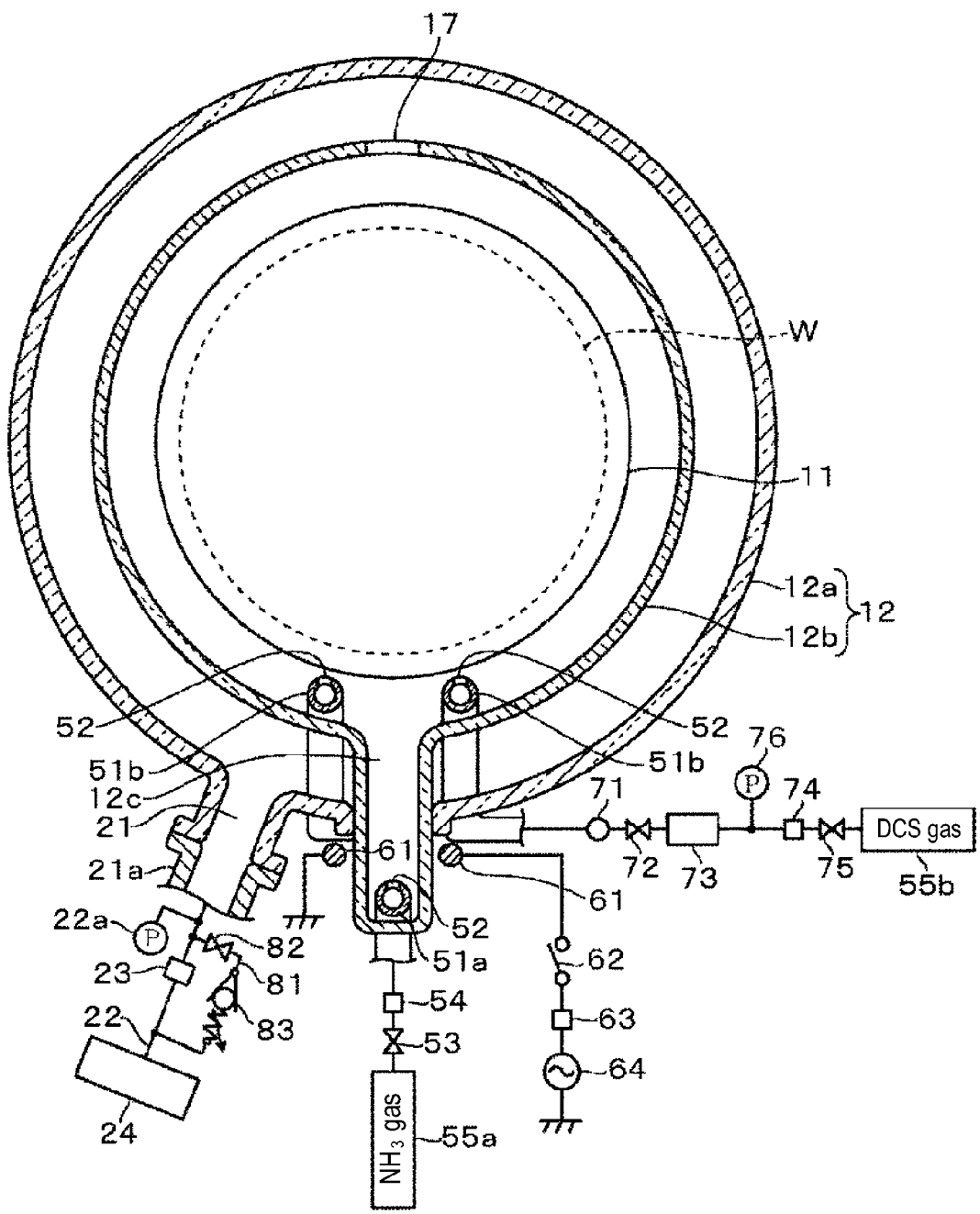
FIG. 4 is a cross-sectional plan view illustrating the film forming apparatus.

As illustrated in FIGS. 3 and 4, the reaction tube 12 is formed to have an approximately cylindrical shape with a lower end portion opened and is configured to be capable of receiving a wafer boat 11, in which a plurality of wafers W (e.g., 150 sheets of wafers) are loaded in the shape of shelves, inside the reaction tube. In this example, the reaction tube 12 is formed of quartz. An opening in the lower end side of the reaction tube 12 is provided with a lid 25 for airtightly closing and opening the opening. The lid 25 can be lifted and lowered by a boat elevator (not shown) together with the wafer boat 11. An approximately cylindrical heating furnace main body 14 is installed on an outer side of the reaction tube 12, and a heater 13 as a heating mechanism is disposed on an inner wall surface of the heating furnace main body 14 in the circumferential direction. In FIG. 3, reference numeral 16 denotes a base plate, reference numeral 26 denotes an insulator, reference numeral 27 denotes a rotation shaft, and reference numeral 28 denotes a driving unit of a motor or the like. Further, in FIG. 3, the heating furnace main body 14, the heater 13, and the base plate 16 are illustrated while being partially cut.

As illustrated in FIGS. 3 and 4, the reaction tube 12 has a dual-tube structure including an outer tube 12a and an inner tube 12b received in the outer tube 12a and is airtightly supported from a lower side by a manifold 18 having an approximately cylindrical shape with upper and lower surfaces opened. As illustrated in FIG. 4, when viewed from the top, a portion of one end side (front side) of the inner tube 12b inflates outwardly in a longitudinal direction of the inner tube 12b to form a plasma generation region 12c, and a portion of an outer circumferential side of the plasma generation region 12c protrudes outwardly relative to the outer tube 12a. In other words, the plasma generation region 12c is formed by opening portions of wall surfaces of the outer tube 12a and the inner tube 12b to have a slit shape in a vertical direction and by welding an opening end and an outer wall surface of a quartz member, which has an approximately box shape with a side facing the wafer boat 11 opened, to openings of the side surfaces of the inner tube 12b and the outer tube 12a, respectively.

An ammonia gas nozzle 51a, which is a process gas supply unit (gas injector) extending in a longitudinal direction of the wafer boat 11, is received in the plasma generation region 12c. A lower end portion of the ammonia gas nozzle 51a airtightly penetrates an inner wall surface of the reaction tube 12 which forms the plasma generation region 12c so as to be connected to an ammonia gas supply source 55a. As illustrated in FIG. 3, an end portion of the ammonia gas nozzle 51a toward the ammonia gas supply source 55a is branched in the middle and is connected to a supply source 55c of a purge gas such as a nitrogen ($N_2$) gas. Further, in FIG. 4, some components for supplying each gas into the reaction tube 12 are omitted.

As illustrated in FIG. 4, a pair of plasma generation electrodes 61 are installed on an outer side of the plasma generation region 12c (an outer side of the reaction tube 12) such that the plasma generation region 12c is interposed between the electrodes, in order to plasma-gasify an ammonia gas supplied from the ammonia gas nozzle 51a. Each of the plasma generation electrodes 61 is formed to extend in a longitudinal direction of the wafer boat 11 and is disposed in a position adjacent to the plasma generation region 12c. A high-frequency power supply 64, whose frequency and output electric power are, e.g., 13.56 MHz and 1 kw, respectively, is connected to the plasma generation electrode 61 through a switching unit 62 and a matching device 63. That is, one plasma generation electrode of the pair of plasma generation electrodes 61 is connected to the high-frequency power supply 64 and the other plasma generation electrode 61 is grounded.

Further, as illustrated in FIG. 4, two raw material gas nozzles 51b for supplying a raw material gas containing silicon (dichlorosilane (DCS) gas in this example) are disposed as raw material gas supply units on both sides of the plasma generation region 12c in proximity to the wafer boat 11. These raw material gas nozzles 51b extend in the longitudinal direction of the wafer boat 11 and join in a lower end position to extend toward a raw material gas supply source 55b through an inner wall surface of the reaction tube 12.

As illustrated in FIGS. 1, 3, and 4, in a supply path 70 between the raw material gas nozzles 51b and the raw material gas supply source 55b, a flow rate adjusting unit (regulation valve) 71, an opening and closing valve 72, a buffer tank 73 that forms a storage portion of a gas, a flow rate adjusting unit (mass flow controller) 74, and an opening and closing valve 75 are disposed in this order from the raw material gas nozzle 51b. The buffer tank 73 is configured to store a raw material gas having a volume ranging from $3 \times 10^{-7}$ $Nm^3$ (0.3 L) to $3 \times 10^{-6}$ $Nm^3$ (3 L). When the volume is defined by the capacity inside the reaction tube 12, the volume ranges from 0.15% to 1.5% of the capacity. A manometer 76 for measuring a gas pressure within the supply path 70 is installed in the supply path 70 between the buffer tank 73 and the flow rate adjusting unit 74.

That is, in this example, the raw material gas from the raw material gas supply source 55b is stored in the buffer tank 73 in an increased pressure state and then the raw material gas is supplied at a high flow rate (0.5 m/s or higher) from the buffer tank 73 to each wafer W. Thus, the flow adjusting unit 74 and the opening and closing valve 75 between the raw material gas supply source 55b and the buffer tank 73 serve to adjust a flow rate of the raw material gas supplied from the raw material gas supply source 55b to the buffer tank 73 and serve to supply or block the raw material gas, respectively.

Further, the above-described manometer 76 serves to measure (detect) a pressure of the raw material gas stored in the buffer tank 73. In addition, the flow rate adjusting unit 71 and the opening and closing valve 72 at a downstream side of the buffer tank 73 serve to adjust a flow rate of the raw material gas supplied to each wafer W and serve to supply or block the raw material gas, respectively. The flow rate adjusting unit 71 and the opening and closing valve 72 are controlled by a control unit 100 such that a high flow rate of raw material gas is supplied at a flow rate as uniform as possible to each wafer W, as described later. An end portion of the downstream side of a supply path 70a extending from the purge gas supply source 55c is connected to a portion of the supply path 70 nearer to the raw material gas nozzle 51b than the flow rate adjusting unit 71. In FIG. 3, reference numeral 52 denotes a gas discharge hole which is formed at every loading position of each wafer W. Further, in FIG. 4, the supply path 70a is omitted.

As illustrated in FIG. 3, a cleaning gas nozzle 51c extending from the supply source 55d of a cleaning gas such as hydrogen fluoride (HF) gas or a fluorine ($F_2$) gas is airtightly inserted in a position adjacent to the position where the gas nozzles 51a and 51b penetrate the inner wall surface of the reaction tube 12. A front end portion of the cleaning gas nozzle 51c is opened in a lower position of the wafer boat 11. In FIG. 3, reference numeral 53 denotes a valve and reference numeral 54 denotes a flow rate adjusting unit. Also, in FIG. 4, the cleaning gas nozzle 51c is omitted.

As illustrated in FIGS. 3 and 4, an approximately circular exhaust 17 is formed in a portion of the inner tube 12b opposing the plasma generation region 12c. The exhaust 17 is arranged in a plurality of portions, e.g., at equal intervals, in a vertical direction. Further, as illustrated in FIG. 3, an exhaust port 21 having a front end portion extending in a flange shape is formed in a position that is laterally spaced apart from the plasma generation region 12c, and a proximal end portion of a vacuum exhaust path 22 is airtightly connected to the exhaust port 21. A manometer 22a for detecting an internal pressure of the vacuum exhaust path 22 is installed in the vacuum exhaust path 22.

As illustrated in FIGS. 1, 3, and 4, a vacuum pump 24 as a vacuum exhaust mechanism is connected to the other end portion of the vacuum exhaust path 22 via a pressure adjusting unit (APC: auto pressure controller) 23 such as a butterfly valve. The internal pressure of the reaction tube 12 may be adjusted depending on an opening degree of the pressure adjusting unit 23. That is, the pressure adjusting unit 23 is configured to adjust an opening degree of a gas flow path in the vacuum exhaust path 22 according to a control signal from the control unit 100 such that the internal pressure (detection value of the manometer 22a) of the reaction tube 12 is maintained as a preset pressure.

One end portion of a bypass line 81 branched from the vacuum exhaust path 22 is connected between the exhaust port 21 and the pressure adjusting unit 23 of the vacuum exhaust path 22, and the other end portion of the bypass line 81 is connected between the pressure adjusting unit 23 and the vacuum pump 24 of the vacuum exhaust path 22. In the bypass line 81, an opening and closing valve 82 and a relief valve 83 as a pressure regulating valve are installed in this order from the reaction tube 12 toward the vacuum pump 24.

The relief valve 83 is configured to automatically open and close a gas flow path in the bypass line 81 depending on a differential pressure between pressure of the side toward vacuum pump 24 (downstream side) in terms of the relief valve 83 and pressure of the side toward reaction tube 12 (upstream side) in terms of the relief valve 83. More specifically, when the differential pressure increases to a certain degree or higher (specifically, the above-described process pressure P1 or higher), the relief valve 83 opens the gas flow path in the bypass line 81, and when the differential pressure is lower than the process pressure P1, the relief valve 83 closes (blocks) the gas flow path.

Thus, since the side toward the vacuum pump 24 rather than the relief valve 83 is set to a vacuum atmosphere all the time by the vacuum pump 24, it may be considered that the relief valve 83 is opened when the internal pressure of the reaction tube 12 is increased to a certain degree or higher.

The above-explained opening and closing valve 82 in the bypass line 81 forms a selection unit for determining whether to use the bypass line 81. The reason for installing the bypass line 81 will be hereinafter described in detail together with an explanation of the operation.

As illustrated in FIG. 3, the control unit 100 configured as a computer for controlling an overall operation of the apparatus is installed in the film forming apparatus, and a program for performing a film forming process described later is stored in a memory of the control unit 100. The program is installed in the control unit 100 from a storage unit 101 which is a storage medium such as a hard disk, a compact disk, a magneto-optical disk, a memory card, or a flexible disk.

Next, an operation of the above-explained embodiment will be described with reference to FIGS. 2 and 5A to 8C. First, the wafer boat 11 on which a product wafer with a pattern formed on a surface thereof and a dummy wafer (bare wafer) are loaded is airtightly transferred into the reaction tube 12 heated to reach a film formation temperature (t0). Subsequently, the pressure adjusting unit 23 (an opening degree of the butterfly valve) is set such that the internal pressure of the reaction tube 12 reaches the process pressure P1 at which a film forming process performed and the opening and closing valve 82 is opened (to allow a gas to flow through the bypass line 81). The bare wafer serves to check a film thickness dimension of a thin film.

Further, a raw material gas having a volume ranging from $3 \times 10^{-7}$ Nm$^3$(0.3 L) to $3 \times 10^{-6}$ Nm$^3$ (3 L) is introduced into the buffer tank 73 in advance. Subsequently, the supply of the raw material gas into the reaction tube 12 starts, while at a time t1, the opening and closing valve 72 is opened and a supply amount of the raw material gas is adjusted by the flow rate adjusting unit 71. Specifically, the purge gas is supplied together with the raw material gas into the reaction tube 12 such that the purge gas pushes the raw material gas out. When the opening and closing valve 72 is opened in this manner, the high flow rate of raw material gas stored in the buffer tank 73 will instantaneously flow toward the interior of the reaction tube 12 even though the supply amount of the raw material gas is adjusted by the flow rate adjusting unit 71 (specifically, even though an opening degree of the flow rate adjusting unit 71 is adjusted as small as possible). Meanwhile, since a response speed of the pressure adjusting unit 23 is not that fast, the internal pressure of the reaction tube 12 will increase.

Figure 5A:
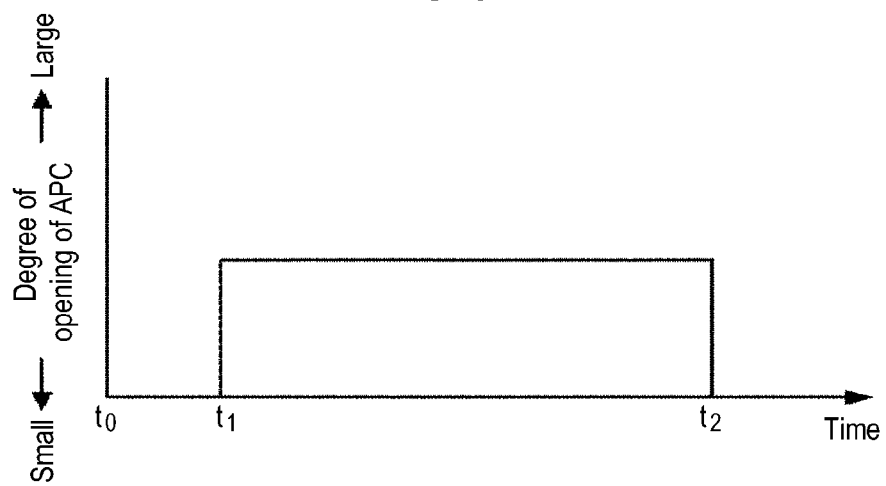
FIGS. 5A and 5B are sequence views illustrating an operation of an exhaust side when a raw material gas is supplied to the film forming apparatus.

That is, as illustrated in FIG. 5A, an adsorption time $\Delta t$ from a time t1 at which the supply of a raw material gas starts to a time t2 at which the supply of the raw material gas stops becomes shorter than a saturation time during which absorption of the raw material gas is saturated. Specifically, the adsorption time $\Delta t$ is two seconds to ten seconds (in this example, three seconds), which is shorter than a time during which a response (adjustment of an opening degree) of the pressure adjusting unit 23 is possible. Thus, in the duration from the time t1 to the time t2 during which the raw material gas is supplied, the pressure adjusting unit 23 has a constant degree of opening, so to speak. Accordingly, in a case that the bypass line 81 is not installed, the internal pressure of the reaction tube 12 follows a curve having an approximately mountain shape as indicated by the dotted line in the above explained FIG. 2 as prior art.

Figure 5B:
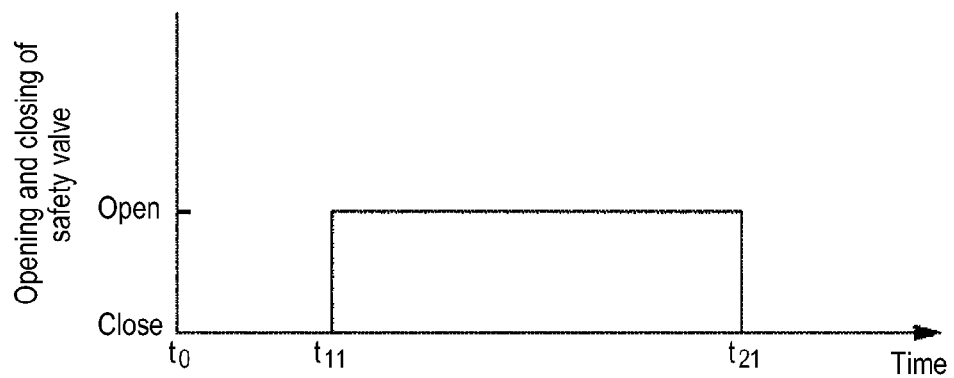
Figure 6:
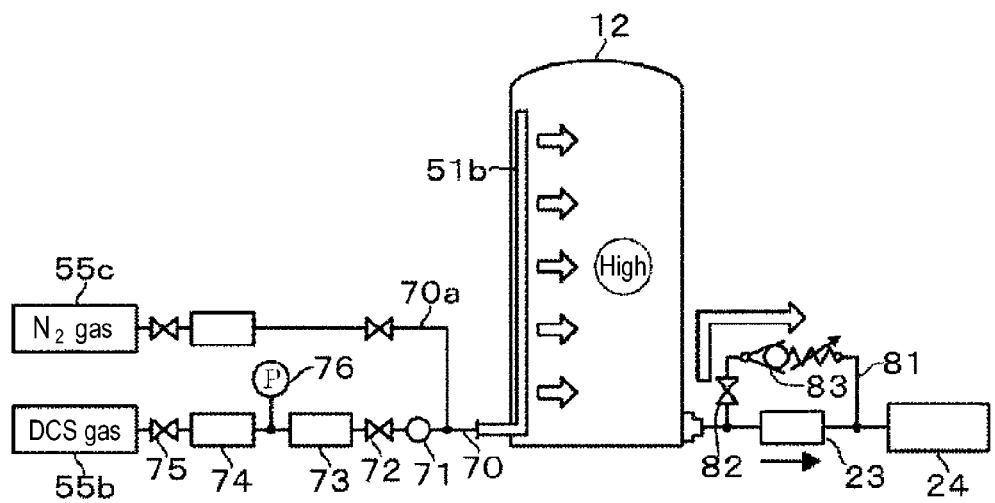
FIG. 6 is a schematic view illustrating the operation of the exhaust side in the film forming apparatus.

However, since the present disclosure installs the bypass line 81 where the relief valve 83 is installed, the pressure at which the relief valve 83 is opened is set to the process pressure P1 described above. Thus, as illustrated in FIG. 5B and FIG. 6, the relief valve 83 is opened in a duration from a time t11 at which the internal pressure of the reaction tube 12 is about to exceed the process pressure P1 to a time t21 at which the internal pressure of the reaction tube 12 is about to be lower than the process pressure P1 according to the reduction of the storage amount of the raw material gas in the buffer tank 73.

Figure 7:
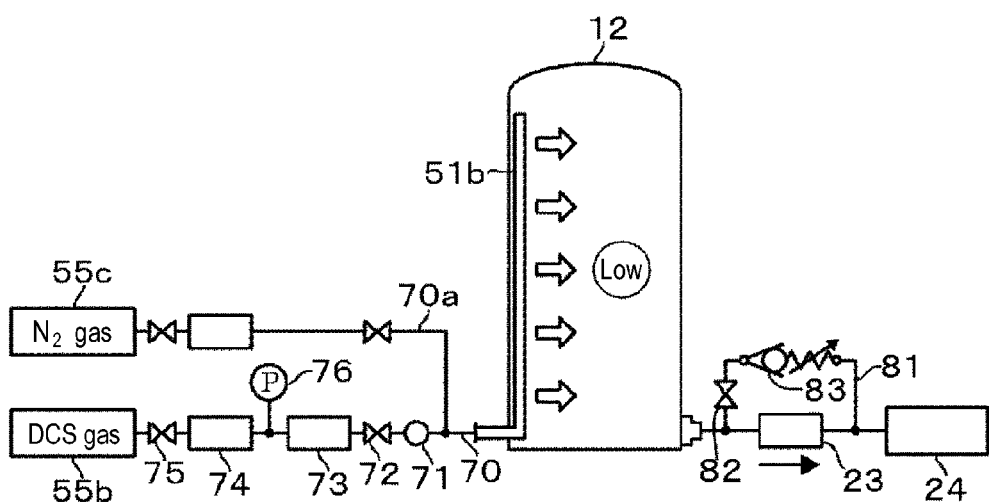
FIG. 7 is a schematic view illustrating the operation of the exhaust side in the film forming apparatus.

Accordingly, as illustrated in the above described FIG. 2, the process pressure P1 is maintained (regulated) from the time t11 to the time t21 within the reaction tube 12. As described below, the process pressure P1 is set to a level at which an adsorption amount of the raw material gas to the product wafer and the bare wafer in the reaction tube 12 is as constant as possible and at which throughput is not reduced. Specifically, the process pressure P1 ranges from 1 Torr (133 Pa) to 5 Torr (666 Pa). As illustrated in FIG. 7, when the internal pressure of the reaction tube 12 does not exceed the process pressure P1, the relief valve 83 is closed, and thus, the raw material gas within the reaction tube 12 is exhausted through the vacuum exhaust path 22. Further, FIG. 2 schematically illustrates the internal pressure of the reaction tube 12.

Here, maintaining (regulating) the process pressure P1 refers to a state in which the internal pressure of the reaction tube 12 was overshot, for example, at an early stage when the supply of the raw material gas starts and then approximately converges to the process pressure P1, and does not mean that the internal pressure stands at the process pressure P1 from the time t1 to the time t2. That is, the difference between the time t1 and the time t11 and the difference between the time t2 and the time t21 are equal to or smaller than ⅓ of the adsorption time $\Delta t$, respectively, and specifically, ranges from 0.2 seconds to 1 second. Thus, the curve (or straight line) indicating fluctuation in the internal pressure of the reaction tube 12 has an approximately rectangular or trapezoid shape as illustrated in the above described FIG. 2.

That is, as described in the background, since the bare wafer has a smaller surface area than the wafer W (product wafer) with a pattern formed on its surface, the bare wafer has a small adsorption amount of the raw material gas. Further, the present disclosure uses the bare wafer to check a film thickness dimension of the product wafer, and in addition, the present disclosure employs the process of stopping supply of the raw material gas before the adsorption amount of the raw material gas is saturated. Thus, during the adsorption time $\Delta t$, the raw material gas is continuously adsorbed (not saturated) regardless of whether it is the bare wafer or the product wafer. Accordingly, in a case that the interior of the reaction tube 12 is filled with a sufficient amount of the raw material gas during the adsorption time $\Delta t$, in other words, when the process pressure P1 within the reaction tube 12 is high to some degree, a film thickness dimension of the thin film further increases in the bare wafer than in the product wafer.

Meanwhile, in a case where the process pressure P1 within the reaction tube 12 is not significantly high, the raw material gas may be insufficient for any of the bare wafer and the product wafer. In other words, it becomes, a so called supply rate limiting state. That is, a difference between the film thickness dimensions of the thin films in the bare wafer and the product wafer is reduced compared to a case that the process pressure P1 is high. And, as the process pressure P1 in the reaction tube 12 is lower, the difference is smaller. Thus, the present disclosure sets the process pressure P1 within the reaction tube 12 as described above such that the film thickness dimensions of the thin films in the bare wafer and the product wafer are as constant as possible and such that degradation of throughput is suppressed (the adsorption time Δt is not too long).

However, when maintaining the internal pressure of the reaction tube 12 as the process pressure P1 as described above, if the raw material gas comes into contact with the surface of the bare wafer or the product wafer, it is quickly adsorbed and consumed. Thus, even though the process pressure P1 within the reaction tube 12 is constant, if concentration of the raw material gas staying within the reaction tube 12 changes over time, the film thickness dimensions of the thin films may change per every film formation cycle or between one batch process among batch processes performed a plurality of times and another subsequent process. Accordingly, in addition to adjustment of the internal pressure of the reaction tube 12, the present disclosure also adjusts concentration of the raw material gas to be constant over the adsorption time Δt as described later.

Figure 8A:
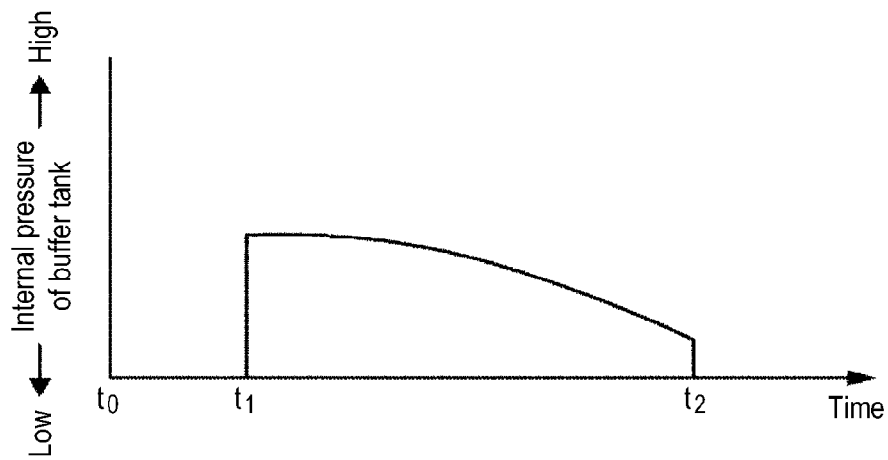
FIGS. 8A to 8C are sequence views illustrating an operation of a supply side when a raw material gas is supplied to the film forming apparatus.
Figure 8B:
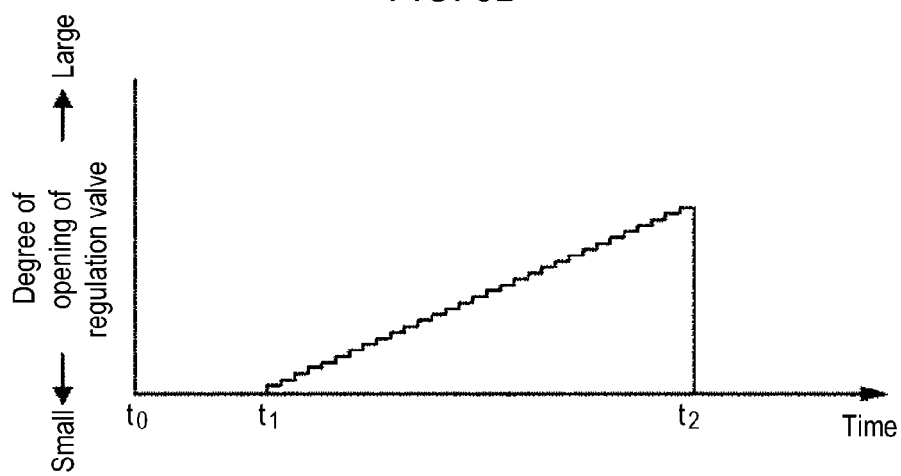
Figure 8C:
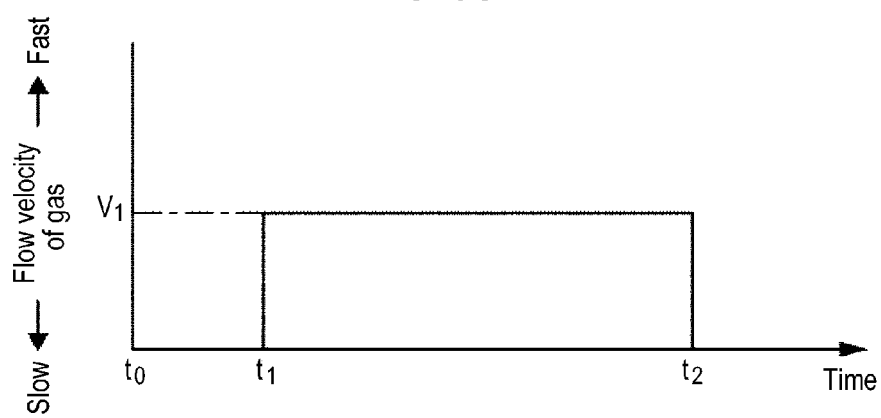

Specifically, the above-described buffer tank 73 serves to temporarily store the raw material gas from the raw material gas supply source 55b, and thus, the pressure of the buffer tank 73 is gradually lowered after the time t1 (when the supply of the raw material gas into the reaction tube 12 starts), as illustrated in FIG. 8A. Thus, as illustrated in FIG. 8B, the present disclosure gradually increases the opening degree of the flow rate adjusting unit 71. Accordingly, as illustrated in FIG. 8C, the supply amount V1 of the raw material gas supplied to the interior of the reaction tube 12 becomes constant from the time t1 to the time t2. Further, FIG. 8B schematically illustrates the opening degree of the flow rate adjusting unit 71.

In addition, when adjusting the supply amount V1 of the raw material gas in this manner, the buffer tank 73 is used as described above. That is, the supply amount V1 of the raw material gas is a high flow rate ranging from 2,000 sccm to 40,000 sccm. A flow velocity of the raw material gas flowing between the wafer W (the bare wafer or the product wafer) loaded in the wafer boat 11 and a separate opposing wafer W in the upper side of the wafer W becomes 0.5 m/s or higher. Thus, although the raw material gas is consumed in the reaction tube 12 through an adsorption reaction, the raw material gas flows at a high flow rate and in a constant supply amount V1 such that consumption of the raw material gas does not appear as the difference between the film thickness dimensions of the thin films in the respective wafers W, or such that even if the difference appears, the flow rate does not cause a problem. That is, as for the supply amount V1 of the raw material gas, the raw material gas has a velocity above the condition in which the adsorption amount is saturated at the above-described process pressure P1 regardless of whether it is the bare wafer or the product wafer. Thus, the absorption amount of the raw material gas adsorbed to the wafer W becomes constant, regardless of the type of the wafer W (a bare wafer or a product wafer) and regardless of the number of wafers W received in the reaction tube 12.

Subsequently, by stopping supply of the raw material gas and allowing the opening degree of the pressure adjusting unit 23 to be fully opened, the raw material gas is rapidly exhausted from the interior of the reaction tube 12. That is, after the adsorption process of the raw material gas is completed, the internal pressure of the reaction tube 12 is quickly lowered such that an extra adsorption layer is not formed by the raw material gas remaining in the reaction tube 12 after completion of the absorption process. Subsequently, the opening and closing valve 82 is closed and an internal atmosphere of the reaction tube 12 is then substituted. Specifically, the reaction tube 12 is vacuumed and a purge gas is then supplied into the reaction tube 12. Thereafter, the supply of the purge gas is stopped and the interior of the reaction tube 12 is set to the process pressure. And then, a high-frequency power is supplied to the plasma generation electrode 61 and an ammonia gas is supplied to the plasma generation region 12c from the ammonia gas nozzle 51a.

The ammonia gas is plasma-gasified by the high-frequency power supplied between the plasma generation electrodes 61 to become active species such as an ion or a radical. When the active species come into contact with the above described adsorption layer on the surface of the wafer W, the adsorption layer is nitrified to form a reaction layer made of a silicon nitride.

Next, while the power supply to the plasma generation electrodes 61 and the supply of the ammonia gas are stopped, the interior of the reaction tube 12 is vacuum-exhausted and then a purge gas is supplied in order to substitute the internal atmosphere of the reaction tube 12. As such, if the process of supplying the raw material gas and the process of supplying the plasma of the ammonia gas as described above are repeatedly performed multiple times while substituting the internal atmosphere of the reaction tube 12, reaction products of the raw material gas and the ammonia gas are stacked to form a thin film made of a silicon nitride.

Next, after the interior of the reaction tube 12 is returned to an air atmosphere, the wafer boat 11 is lowered to a lower position within the reaction tube 12 and processed wafers W are replaced with wafers W to be processed. At this time, since the opening and closing valve 82 is already closed, the air atmosphere is not introduced to the bypass line 81.

According to the embodiment described above, the bypass line 81 is installed in the vacuum exhaust path 22 that vacuum-exhausts the interior of the reaction tube 12 and the relief valve 83 is disposed in the bypass line 81. Thus, when the raw material gas is supplied into the reaction tube 12, the internal pressure of the reaction tube 12 can be maintained as the process pressure P1. Further, since the flow rate adjusting unit 71 is installed in the downstream side of the buffer tank 73 which stores the raw material gas in an increased pressure state, the supply amount V1 of the raw material gas can be constant during the adsorption time Δt when a high flow rate of raw material gas is supplied. Thus, since the raw material gas is rarefied within the reaction tube 12 and in addition, new raw material gas is supplied in a high flow rate in the rarefied state, the film thickness dimension of the thin film can be constant between respective wafers W. Further, even when the number of wafers W loaded in the reaction tube 12 is great or small, concentration of the raw material gas staying under the atmosphere becomes constant, and thus, it is possible to form thin films having a uniform film thickness dimension regardless of the loading number of the wafers.

In addition, the raw material gas flows from one side (from the raw material gas nozzle 51b side) to the other side (the exhaust 17 side) in each of the plurality of wafers W stacked within the reaction tube 12. As described above, the raw material gas is supplied in a higher flow rate of supply amount V1 than the saturation condition at the process pressure P1. Thus, since it is difficult to generate a concentration difference between the one side and the other side by consumption of the raw material gas, the film thickness dimension of the thin film on the plane of each of the wafers W can be uniform. Accordingly, for example, it is not necessary to strictly set the process conditions such as a film formation temperature, and thus, it is possible to increase a degree of freedom of process and obtain a high yield rate for the thin films.

Here, it will be reviewed as to the case in which the process pressure P1 is maintained for the adsorption time Δt without employing the method of the present disclosure. That is, for example, if the pressure adjusting unit 23 is fully opened when the raw material gas is supplied, the pressure fluctuation close to FIG. 2 described above may be obtained. However, when the flow rate adjusting unit 71 does not adjust the flow rate of the raw material gas, a difference occurs in consumption of the raw material gas between the bare wafer and the product wafer, and thus, the film thickness dimensions of the thin films also become different. Further, if the supply side of the raw material gas is closed (sealed) after the raw material gas is introduced into the reaction tube 12, a difference likewise occurs in consumption of the raw material gas between the bare wafer and the product wafer. Moreover, when the buffer tank 73 is not used, the raw material gas is not supplied in a high flow rate. The internal pressure of the reaction tube 12 might be maintained at the process pressure P1, but throughput is reduced. Thus, the method of the present disclosure is an effective method that can control the film thickness dimensions of the thin films on the assumption that the raw material gas is supplied in a high flow rate.

Further, with respect to installing the relief valve 83, the opening and closing valve 82 is also installed in the bypass line 81 together with the relief valve 83. Thus, during a process of supplying a gas (the ammonia gas or the purge gas) other than the raw material gas into the reaction tube 12 or when returning the interior of the reaction tube 12 to the air atmosphere, it is possible to prevent an unexpected gas from being introduced to the bypass line 81.

Hereinafter, it will be described as to a specific method for making the supply amount V1 of the raw material gas be constant over the adsorption time. That is, an experiment is conducted using a nitrogen gas or the like in advance in order to check a change of pressure gradient over time or a change of a gas flow rate over time before and after the flow rate adjusting unit 71. Based on the experiment results, the opening degree of the above described flow rate adjusting unit 71 is adjusted. Further, specific values of the supply amount V1 and the process pressure P1 are set by conducting experiments in advance per each process because they vary depending on the gas type and the film formation temperature.

As the above described flow rate adjusting unit 71, a mass flow controller which can respond at a high speed may be used instead of the above described regulation valve. Further, as the flow rate adjusting unit 71, an orifice may be used. That is, an inner capacity of the buffer tank 73 may be designed based on an inner capacity of the reaction tube 12 positioned at the downstream side than the flow rate adjusting unit 71, and a high flow rate of raw material gas may be uniquely supplied in a constant flow rate. Furthermore, as the relief valve 83, an auto pressure controller which can respond (control) at a high speed may be used. Also, without installing the relief valve 83, the opening and closing valve 82 may be configured to be opened and closed at a high speed cooperatively depending on the pressure detection result of the manometer 22a. In this case, the opening and closing valve 82 forms the pressure regulating valve recited in the claims.

Further, the present disclosure may also be applied to a single-wafer-type film forming apparatus for performing a film forming process on wafers one by one, instead of the batch-type vertical heat processing apparatus. In such a single-wafer-type film forming apparatus, after performing a test for checking a film thickness dimension of a thin film in a bare wafer in advance, process conditions are set (adjusted) in a following film forming process on a product wafer based on the test results.

Further, even though the upstream end of the reaction tube 12 side in the bypass line 81 is connected to the vacuum exhaust path 22, the upstream end may be connected to the reaction tube 12. That is, two vacuum exhaust paths 22 may be connected to the reaction tube 12. One vacuum exhaust path 22 may be used as a main flow path (where the pressure adjusting unit 23 is installed) and the other vacuum exhaust path 22 may be used as a sub-flow path (where the relief valve 83 is installed). In this case, the downstream ends of one vacuum exhaust path 22 and the other vacuum exhaust path 22 may be connected to the common vacuum pump 24, respectively, or may be connected to separate vacuum pumps 24.

The process to which the present disclosure is applied is an ALD process that alternately supplies a raw material gas and a reaction gas, and a specific film formation type is a silicon oxide (Si—O) film or a high-k film, in addition to the above described silicon nitride film. When the high-k film is formed, a raw material gas, e.g., a tetrakisethylmethylaminozirconium (TEMAZ) gas, a tetrakisethylmethylaminohafnium (TEMHF) gas, a strontiumbistetramethylheptanedionate) (Sr(THD)$_2$) gas, a trimethylaluminum (TMA) gas, or a titaniummethylpentanedionatobistetramethylheptanedionato (Ti(MPD)(THD)) gas, may be used.

[Embodiment]

Subsequently, the embodiment carried out in the present disclosure will be described.

Specifically, it was checked how a film thickness dimension of a thin film changed when increasing a supply time of a raw material gas in a case without the bypass line 81 or the relief valve 83 installed. That is, a film forming process was performed on a bare wafer with a smooth surface and a product wafer with a pattern formed on its surface under common process conditions (condition in which an adsorption amount of the raw material gas was not saturated). As a result, as illustrated in FIG. 9, the film thickness dimension of the bare wafer was greater than that of the product wafer.

Further, when increasing the supply amount of the raw material gas for the bare wafer and the product wafer within a range in which the adsorption amount of the raw material gas was not saturated, the film thickness dimension was increased in all of the wafers and the increment of the film thickness dimensions of the bare wafer and the product wafer was equal. That is, as described above, under the condition in which the adsorption amount of the raw material gas was not saturated, the adsorption amount of the raw material gas continuously increased in all of the bare wafer and the product wafer. Thus, it was found that simply increasing the supply time of the raw material gas cannot resolve the difference in the film thickness dimensions between these wafers. In cases in which the supply amount of the raw material gas is great and small, FIG. 9 indicates the reduction rate of the film thickness as values obtained by dividing a value obtained by subtracting the film thickness dimension of the product wafer from the film thickness dimension of the bare wafer by the film thickness dimension of the bare wafer appear. From the comparison of the reduction rate of the film thickness, it can be also found that it is difficult to improve the difference in the film thickness dimensions between the wafers by simply increasing the supply time of the raw material gas.

Figure 10:
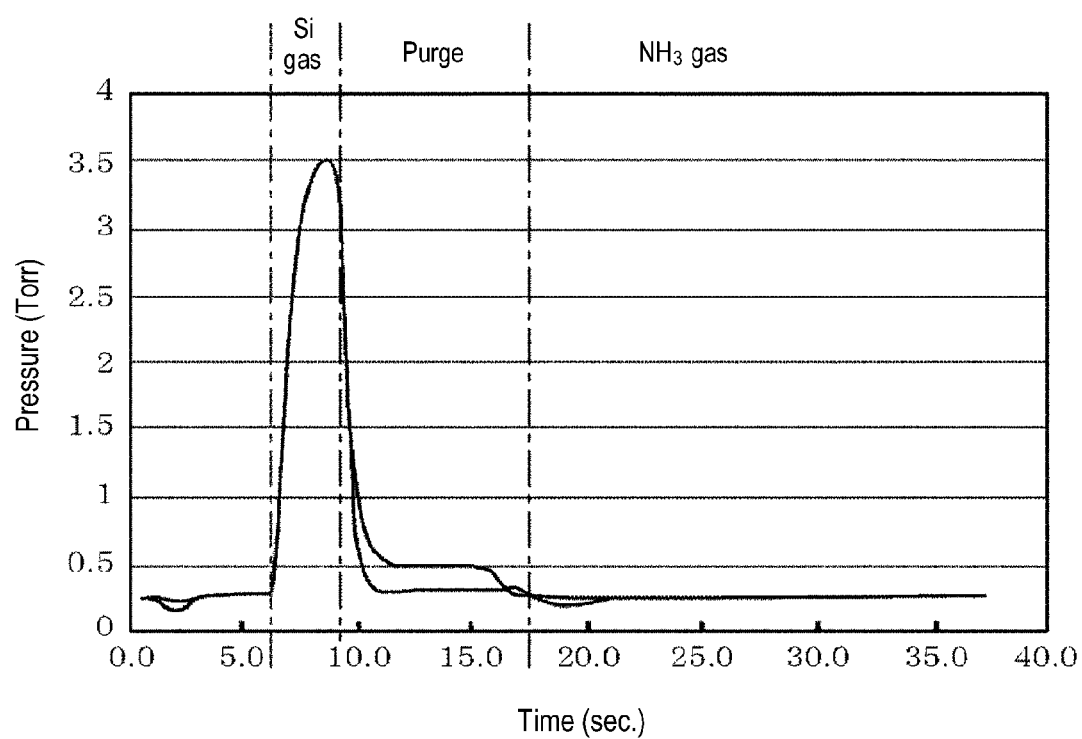
FIG. 10 is a characteristic view illustrating transitions of a gas pressure in a general ALD method.

FIG. 10 illustrates the measurement result of an internal pressure of the reaction tube 12 in a series of film formation cycles of supplying each of the gases (raw material gas, purge gas, and ammonia gas) when the bypass line 81 or the relief valve 83 is not installed. As can be seen from FIG. 10, since the raw material gas is supplied in a high flow rate and for a short time through the buffer tank 73, it cannot perfectly maintain the process pressure P1 only with the pressure adjusting unit 23, and thus, the internal pressure of the reaction tube 12 has a mountain-shaped curve. Thus, it can be said that the method of the present disclosure is very effective when supplying a raw material gas in a high flow rate and for a short time.

According to the present disclosure, the pressure regulating valve is installed in the vacuum exhaust path (bypath path) configured to vacuum-exhaust the interior of the reaction container and the flow rate adjusting valve is disposed in the downstream side of the tank which stores the raw material gas in an increased pressure state. As a result, when the raw material gas is supplied into the reaction container, the internal pressure of the reaction container can be maintained as the process pressure by the pressure regulating valve and the raw material gas can be supplied into the reaction container in a high flow rate and in a uniform flow rate. Thus, even when the film forming process is performed on substrates with different surface areas, film thickness dimensions of thin films can be constant between respective substrates. Further, when the film forming process is collectively performed on a plurality of substrates, the film thickness dimensions of the thin films can be constant regardless of the number of substrates received in the reaction container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for forming a thin film on a substrate in a reaction container by alternately supplying a raw material gas and a reaction gas, which reacts with the raw material gas to generate a reaction product, into the reaction container under a vacuum atmosphere, the apparatus comprising:

a raw material gas supply unit installed in an end portion of a supply path of the raw material gas to supply the raw material gas into the reaction container;

a pressure adjusting valve installed in an vacuum exhaust path configured to vacuum-exhaust an interior of the reaction container;

a pressure regulating valve configured to regulate an internal pressure of the reaction container to a preset pressure and an opening and closing valve which are respectively installed in a bypass path detouring the pressure adjusting valve;

a tank installed in the middle of the supply path of the raw material gas and configured to store the raw material gas in an increased pressure state;

a flow rate adjusting valve installed in a downstream side of the tank in the supply path of the raw material gas; and a control unit configured to control the opening and closing valve to be opened when the raw material gas stored in the tank is supplied into the reaction container, wherein the control unit is configured to maintain a constant flow velocity from the tank to the interior of the reaction container by intermittently increasing an opening degree of the flow rate adjusting valve as a pressure within the tank decreases.

2. The apparatus of claim 1, wherein the control unit controls the opening and closing valve to be closed when the internal pressure of the reaction container returns to a normal pressure.

3. The apparatus of claim 1, wherein a supply time of the raw material gas ranges from 2 to 10 seconds.

4. The apparatus of claim 1, wherein the internal pressure of the reaction container ranges from 133 Pa to 666 Pa when the raw material gas is supplied.

5. The apparatus of claim 1, wherein a flow velocity of the raw material gas is 0.5 m/s or higher when it passes through a surface of the substrate within the reaction container.

6. The apparatus of claim 1, further comprising a substrate holder in which the substrate is loaded in a shelf shape, wherein the reaction container has a vertical shape to receive the substrate holder airtightly; and wherein the raw material gas supply unit is a raw material gas nozzle which is installed to extend in an arrangement direction of the substrate in the substrate holder and which has a plurality of gas discharge holes formed in a longitudinal direction of the nozzle.

7. The apparatus of claim 1, wherein the pressure regulating valve is a relief valve.

* * * * *